United States Patent
Isogai et al.

(10) Patent No.: US 10,153,262 B2
(45) Date of Patent: Dec. 11, 2018

(54) SEMICONDUCTOR DEVICE AND MANUFACTURING METHOD THEREOF

(71) Applicant: TOSHIBA MEMORY CORPORATION, Minato-ku (JP)

(72) Inventors: Tatsunori Isogai, Yokkaichi (JP); Masaki Noguchi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/699,609

(22) Filed: Sep. 8, 2017

(65) Prior Publication Data
US 2018/0269196 A1    Sep. 20, 2018

(30) Foreign Application Priority Data
Mar. 16, 2017  (JP) .................. 2017-051693

(51) Int. Cl.
*H01L 27/02* (2006.01)
*H01L 27/11521* (2017.01)
(Continued)

(52) U.S. Cl.
CPC .... *H01L 27/0203* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 27/11582* (2013.01)

(58) Field of Classification Search
CPC ......... H01L 27/11582; H01L 27/11556; H01L 29/66833; H01L 29/792; H01L 21/28282; H01L 27/0203; H01L 27/11573; H01L 27/11568; H01L 27/11526; H01L 27/11521
See application file for complete search history.

(56) References Cited

U.S. PATENT DOCUMENTS 8,253,189 B2   8/2012   Sekine et al.
8,409,977 B2   4/2013   Shim et al.
(Continued)

FOREIGN PATENT DOCUMENTS

JP   2009-10166   1/2009
JP   2010-56533   3/2010
(Continued)

*Primary Examiner* — Victor A Mandala
(74) *Attorney, Agent, or Firm* — Oblon, McClelland, Maier & Neustadt, L.L.P.

(57) ABSTRACT

According to an embodiment, a semiconductor device includes: a stacked body in which insulator layers and conductor layers alternately stacked; a block insulator film on a surface of the insulator layer and a surface of the conductor layer; a charge storage capacitor film on a surface of the block insulator film; a tunnel insulator film including a first insulator film on a surface of the charge storage capacitor film, a second insulator film on a surface of the first insulator film, and a third insulator film on a surface of the second insulator film; and a channel film on a surface of the third insulator film. A defect termination element is included in at least the first or the third insulator film, and defect termination element content concentrations of the first, the second, and the third insulator film are different from one another.

4 Claims, 7 Drawing Sheets

(51) Int. Cl.
*H01L 27/11526* (2017.01)
*H01L 27/11582* (2017.01)
*H01L 27/11568* (2017.01)
*H01L 27/11573* (2017.01)
*H01L 27/11556* (2017.01)

(56) References Cited

U.S. PATENT DOCUMENTS

| | | | | |
|---|---|---|---|---|
| 2010/0019312 | A1* | 1/2010 | Sekine | H01L 27/11565 |
| | | | | 257/326 |
| 2011/0104869 | A1 | 5/2011 | Hyun et al. | |
| 2011/0233648 | A1 | 9/2011 | Seol et al. | |
| 2012/0287694 | A1 | 11/2012 | Hyun et al. | |
| 2015/0318297 | A1* | 11/2015 | Hada | H01L 27/11582 |
| | | | | 438/269 |
| 2016/0148947 | A1* | 5/2016 | Seo | H01L 27/11582 |
| | | | | 257/324 |

FOREIGN PATENT DOCUMENTS

| | | |
|---|---|---|
| JP | 5443873 | 3/2014 |
| JP | 5670681 | 2/2015 |
| JP | 5832114 | 12/2015 |

\* cited by examiner

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2017-051693, filed on Mar. 16, 2017; the entire contents of which are incorporated herein by reference.

FIELD

Embodiments of the present invention relate to a semiconductor device and a manufacturing method thereof.

BACKGROUND

For some semiconductor devices, development of three-dimensional semiconductor memories is progressing. A three-dimensional semiconductor memory has a stacked body having insulator layers and conductor layers alternately stacked. In this stacked body, memory cells are provided. The memory cells are formed of cell insulator films such as a block insulator film, a charge storage capacitor film and a tunnel insulator film, a channel film, and a core.

The aforementioned cell insulator films are sometimes caused to include defect termination elements in order to deal with defects existing in the films and defects arising in forming interfaces between different types of films. However, there is a possibility that it is insufficient as measures against the aforementioned defects to merely uniformly cause the cell insulator films to include such defect termination elements.

A problem to be solved by the present invention is to provide a semiconductor device and a manufacturing method of the same capable of improving measures against defects which can arise in film formation.

DETAILED DESCRIPTION

Embodiments will now be explained with reference to the accompanying drawings. The present invention is not limited to the embodiments.

First Embodiment

Figure 1:
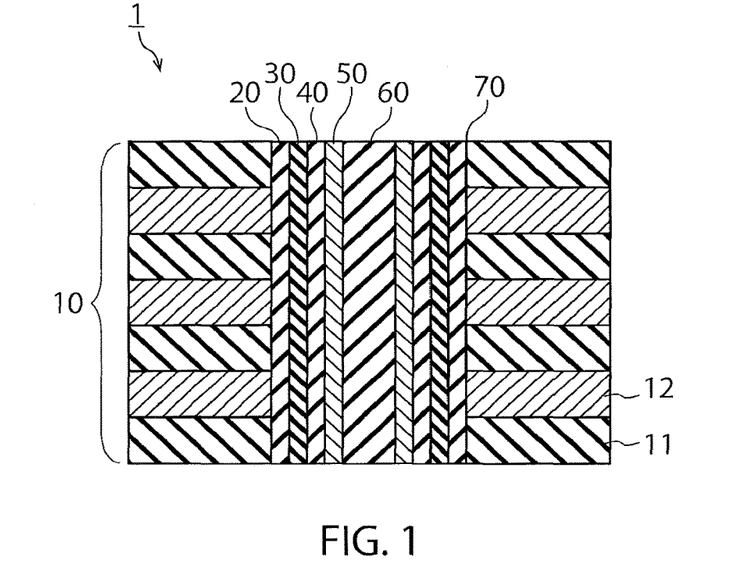
FIG. 1 is a cross-sectional view of the essential part of a semiconductor device according to a first embodiment.

FIG. 1 is a cross-sectional view of the essential part of a semiconductor device according to a first embodiment. A semiconductor device 1 shown in FIG. 1 can be applied to a so-called charge trapping three-dimensional semiconductor memory which stores a charge in an insulator film.

As shown in FIG. 1, the semiconductor device 1 includes a stacked body 10, a block insulator film 20, a charge storage capacitor film 30, a tunnel insulator film 40, a channel film 50 and a core film 60. The block insulator film 20, the charge storage capacitor film 30 and the tunnel insulator film 40 constitute a cell insulator film. Moreover, this cell insulator film, the channel film 50 and the core film 60 constitute memory cells.

In the stacked body 10, insulator layers 11 and conductor layers 12 are alternately stacked. The insulator layers 11 are formed, for example, using silicon oxide ($SiO_2$). The conductor layers 12 are formed, for example, using tungsten. The conductor layers 12 function as word lines. The insulator layers 11 are provided for securing insulation between the word lines.

The block insulator film 20 is in a memory hole penetrating the stacked body 10. The block insulator film 20 is formed, for example, of silicon oxide, a high dielectric constant insulator film (high-k film), a combination of these, or the like.

The charge storage capacitor film 30 is on the surface of the block insulator film 20. The charge storage capacitor film 30 is formed, for example, using silicon nitride (SiN). Upon application of a voltage onto the conductor layer 12, a charge is stored in the charge storage capacitor film 30.

Figure 2:
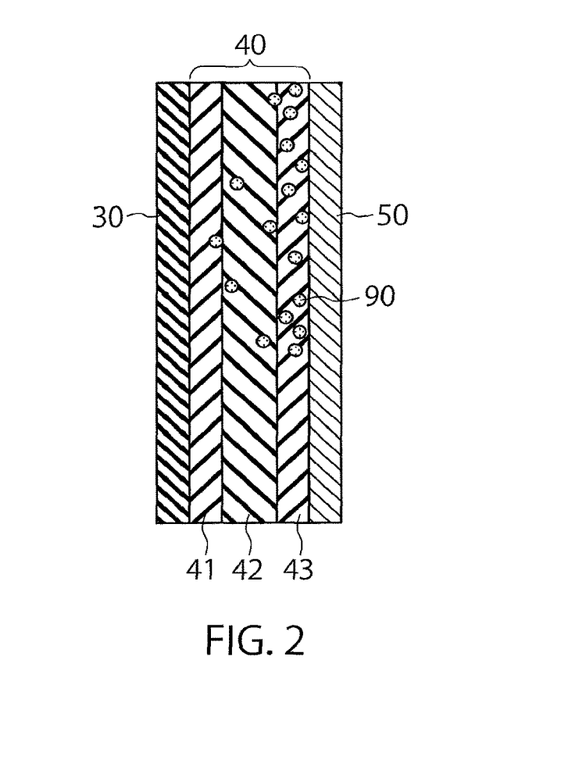
FIG. 2 is a cross-sectional view having a tunnel insulator film expanded.

FIG. 2 is a cross-sectional view having the tunnel insulator film 40 expanded. As shown in FIG. 2, the tunnel insulator film 40 has a first insulator film 41, a second insulator film 42 and a third insulator film 43. The first insulator film 41 is on the surface of the charge storage capacitor film 30. The second insulator film 42 is on the surface of the first insulator film 41. The third insulator film 43 is on the surface of the second insulator film 42. The first insulator film 41 and the third insulator film 43 are formed, for example, using silicon oxide. The second insulator film 42 is formed, for example, using silicon oxide nitride (SiON). Notably, these insulator films may be high dielectric constant insulator films (high-k films).

In the first insulator film 41, the second insulator film 42 and the third insulator film 43, defect termination elements 90 respectively set to have different concentrations are included. The defect termination element 90 may be a substance which can terminate a dangling bond of silicon and a dangling bond of nitrogen. For example, hydrogen (H), fluorine (F), carbon (C), nitrogen (N), selenium (Se), or any of compounds of these can be used as the defect termination element 90.

The channel film 50 is on the surface of the third insulator film 43. The channel film 50 is formed, for example, using polysilicon or amorphous silicon. The core film 60 is formed for closing the memory hole, on the surface of the channel film 50. The core film 60 is formed, for example, using silicon oxide.

Hereafter, referring to FIG. 3 to FIG. 7, a manufacturing method of the semiconductor device 1 according to the present embodiment is described.

Figure 3:
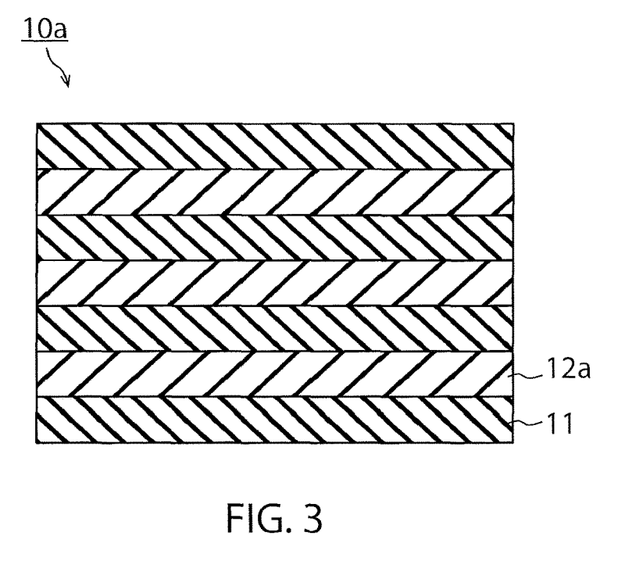
FIG. 3 is a cross-sectional view showing a step of forming a stacked body.

First, as shown in FIG. 3, the insulator layers 11 (first insulator layers) and insulator layers 12a (second insulator layers) alternately form a stacked body 10a. The insulator layers 12a are formed, for example, of silicon nitride. The insulator layers 11 and the insulator layers 12a are formed, for example, using a CVD (Chemical Vapor Deposition) method or an ALD (Atomic Layer Deposition) method.

Figure 4:
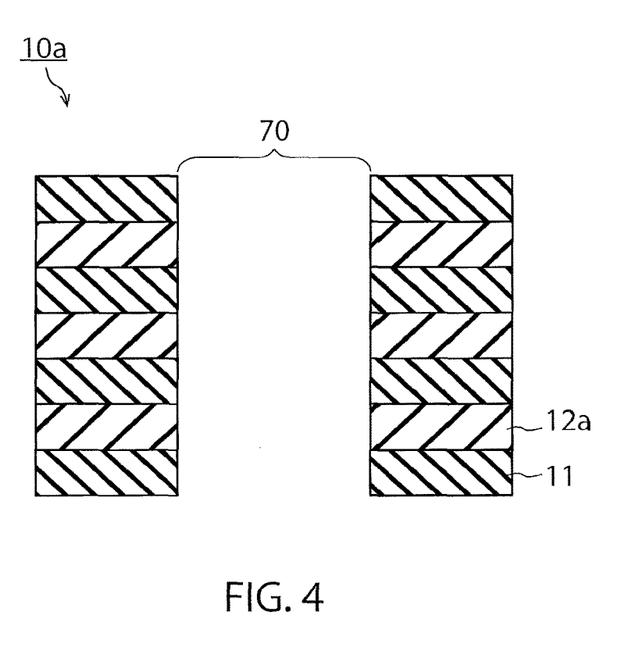
FIG. 4 is a cross-sectional view showing a step of forming a memory hole.

Next, as shown in FIG. 4, a memory hole 70 penetrating the stacked body 10a is formed. The memory hole 70 is formed, for example, using an RIE (Reactive Ion Etching) method.

Figure 5:
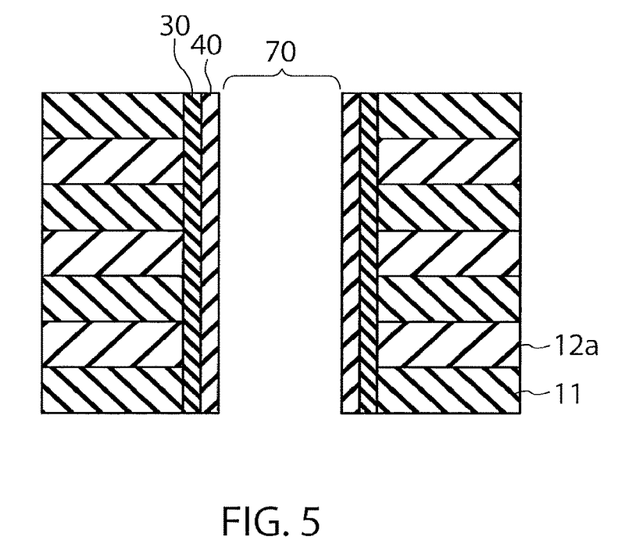
FIG. 5 is a cross-sectional view showing a step of forming a block insulator film and a charge storage capacitor film.

Next, as shown in FIG. 5, the block insulator film 20 and the charge storage capacitor film 30 are sequentially formed in the memory hole 70. The block insulator film 20 and the charge storage capacitor film 30 are formed, for example, using the CVD method or the ALD method.

Next, the tunnel insulator film 40 is formed on the surface of the charge storage capacitor film 30 using the ALD method. Here, a forming method of the tunnel insulator film 40 is described in detail with reference to FIG. 6.

Figure 6:
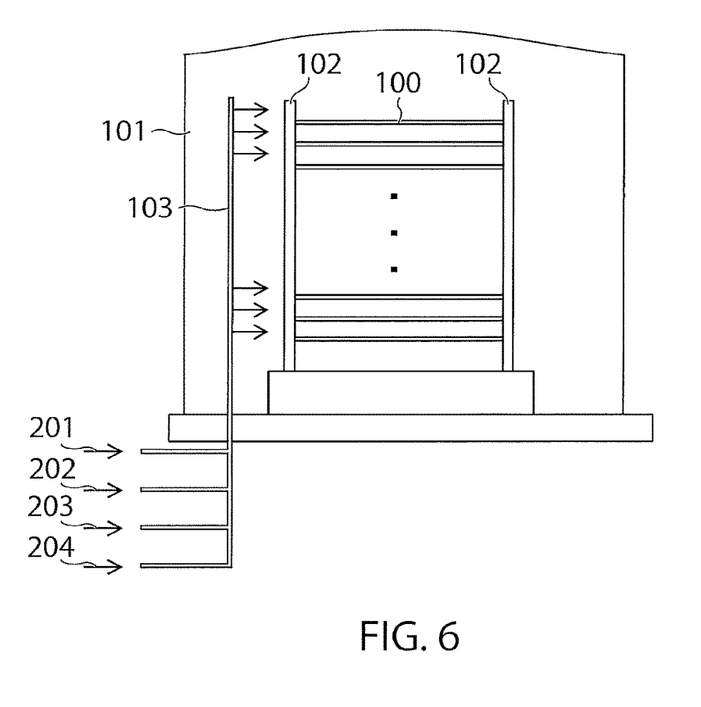
FIG. 6 is a cross-sectional view showing a step of forming a tunnel insulator film.

First, as shown in FIG. 6, silicon substrates 100 in each of which the block insulator film 20 and the charge storage capacitor film 30 are formed in the memory hole 70 are carried in a process chamber 101. Herein, a plurality of silicon substrates 100 are carried in the process chamber 101 with these supported on support members 102 and spaced from one another.

Next, the interior of the process chamber 101 is evacuated into a vacuum and the temperature thereof is raised. After the temperature in the process chamber 101 reaches a predetermined temperature, material gas 201, reformation gas 202 and oxidation gas 203 are fed into the process chamber 101 from a pipe 103. As a result, the first insulator film 41 is formed.

In forming the first insulator film 41, the material gas 201, for example, including tetrachlorosilane is used. In place of tetrachlorosilane, the material gas 201 may include dichlorodisilane, hexachlorodisilane or the like.

The reformation gas 202 includes, for example, deuterium as defect termination elements. Notably, these defect termination elements may be hydrogen, fluorine, carbon, selenium, or any of compounds of these other than deuterium. The reformation gas 202 may be introduced into the process chamber 101 simultaneously along with the material gas 201, or may be introduced before or after introducing the material gas 201, or may be introduced as pretreatment or after-treatment in the ALD method.

The oxidation gas 203 includes oxygen. In place of oxygen, the oxidation gas 203 may include ozone, water, heavy water, oxygen radicals or the like. For water and heavy water, the oxidation gas 203 may be formed through bubbling of or a carburetor for a raw material of these. Moreover, the oxidation gas 203 may be formed through catalytic reaction of hydrogen or deuterium and oxygen in the process chamber 101. In the case of using oxygen radicals, the oxidation gas 203 may be formed by a method of mixing hydrogen or deuterium and oxygen in the process chamber 101 to perform thermal reaction of these into radicals. Or using plasma, such oxidation gas 203 may be formed.

After the first insulator film 41 is formed as above, the second insulator film 42 is subsequently formed. In forming the second insulator film 42, nitriding gas 204 is also introduced into the process chamber 101 in addition to the material gas 201, the reformation gas 202 and the oxidation gas 203. The nitriding gas 204 includes, for example, ammonia ($NH_3$).

In the present embodiment, in order to bond silicon and deuterium, the material gas 201 and the reformation gas 202 are simultaneously introduced into the process chamber 101. Moreover, after introducing the nitriding gas 204, unnecessary substances are purged with deuterium included in the reformation gas 202, and thereby, hydrogen of ammonia included in the nitriding gas 204 is replaced by deuterium. While in the present embodiment, the reformation gas 202 including deuterium and the nitriding gas 204 including ammonia are used, heavy ammonia gas which is mixture gas of deuterium and ammonia may be used.

After the second insulator film 42 is formed as above, the third insulator film 43 is subsequently formed. The third insulator film 43 is formed by a method similar to that for the first insulator film 41. As above, the tunnel insulator film 40 is completed.

In the present embodiment, using the ALD method, the first insulator film 41, the second insulator film 42 and the third insulator film 43 are formed. Therefore, when each insulator film is formed, the concentration of the defect termination elements 90 included in the reformation gas 202 can be freely adjusted.

For example, by increasing the concentration of the defect termination elements 90 (herein, deuterium) included in the first insulator film 41 more than those for the second insulator film 42 and the third insulator film 43, electric stress durability can be improved while reforming an oxide film formed through natural oxidation on the surface of the charge storage capacitor film 30 including silicon nitride. Thereby, a trap level at the interface between the charge storage capacitor film 30 and the first insulator film 41 is reduced. Thereby, there comes a possibility of obtaining effects of improvement of charge holding characteristics and reduction of interference between adjacent memory cells.

Moreover, by increasing the concentration of the defect termination elements 90 included in the second insulator film 42 more than those for the first insulator film 41 and the third insulator film 43, electric stress durability of the second insulator film 42 is improved. Therefore, even under repetition of injection of electrons and holes with respect to the charge storage capacitor film 30, that is, repetition of writing, reading and erasing of data, deterioration of the second insulator film 42 is suppressed. This can contribute prevention of erroneous writing of data in writing operation and erroneous writing of data in reading operation, improvement of charge holding characteristics, and the like.

Furthermore, by increasing the concentration of the defect termination elements 90 included in the third insulator film 43 more than those for the first insulator film 41 and the second insulator film 42, the interface between the second insulator film 42 and the third insulator film 43 can be reformed, and electric stress durability of the third insulator film 43 can be improved. Since electrons and holes are injected into the charge storage capacitor film 30 via the tunnel insulator film 40, reformation of the third insulator film 43 can also contribute prevention of erroneous writing of data in writing operation and erroneous writing of data in reading operation, improvement of charge holding characteristics, and the like.

Figure 7:
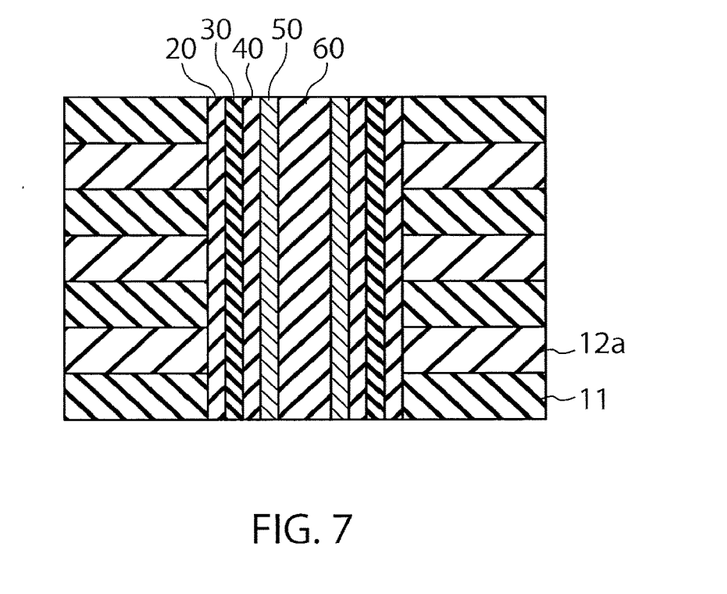
FIG. 7 is a cross-sectional view showing a step of forming a channel film and a core film.

After the tunnel insulator film 40 is formed as above, as shown in FIG. 7, the channel film 50 and the core film 60 are formed. The channel film 50 is formed on the third insulator film 43, for example, using the CVD method. The core film 60 is embedded into the memory hole 70, for example, using the ALD method or the CVD method.

After that, the insulator layers 12a are removed with a liquid chemical such, for example, as phosphoric acid. In gaps formed by the removal of the insulator layers 12a, the conductor layers 12 are formed, for example, using the CVD method or the ALD method.

According to the present embodiment described above, in forming the first insulator film 41, the second insulator film 42 and the third insulator film 43 constituting the tunnel insulator film 40, the reformation gases 202 including the defect termination elements 90 in different concentrations from one another are used. Therefore, for each insulator film, the concentration of the defect termination elements 90 can be optimized. Accordingly, sufficient measures can be applied against various kinds of inconvenience caused by defects existing in the film and defects arising in forming an interface between different types of films.

Moreover, in the present embodiment, the tunnel insulator film 40 is formed using the ALD method. Therefore, as compared with a method in which after forming a target film which is to be caused to include high concentration defect termination elements, through a thermal treatment in an atmosphere including defect termination elements, the target film is caused to include the defect termination elements 90, thermal load on peripheral circuits can be reduced. Notably, depending on a kind of the defect termination elements 90, the defect termination elements 90 are preferably introduced at the lower temperature as after-treatment of the ALD method. In the case of using fluorine, in the after-treatment, it is optimum to introduce fluorine for about 10 minutes at a temperature range of 300 deg C. to 380 deg C.

Notably, the defect termination elements 90 may be included in at least any of the block insulator film 20 and the charge storage capacitor film 30 as well as in the tunnel insulator film 40. In this case, by using the aforementioned reformation gas 202 when forming the block insulator film 20 and the charge storage capacitor film 30 using the ALD method, each of the block insulator film 20 and the charge storage capacitor film 30 can be caused to include high concentration defect termination elements 90.

When the charge storage capacitor film 30 is formed using the reformation gas 202 including the defect termination elements 90, impurities sticking to the interface between the block insulator film 20 and the charge storage capacitor film 30 can be removed. In this case, low trap level portions at the interface and in the charge storage capacitor film 30 can be removed. As a result, electrons escaping through in the vertical direction which is the direction in which an electric filed is applied can be suppressed. Hence, there are expected effects of improvement of charge holding characteristics and reduction of interference between adjacent memory cells.

Meanwhile, when the block insulator film 20 is formed using the aforementioned reformation gas 202, low trap level portions in the block insulator film 20 can be removed. Therefore, a leak current is reduced and back tunneling is suppressed. Thereby, there is expected improvement of data erasing characteristics and charge holding characteristics.

Second Embodiment

Figure 8:
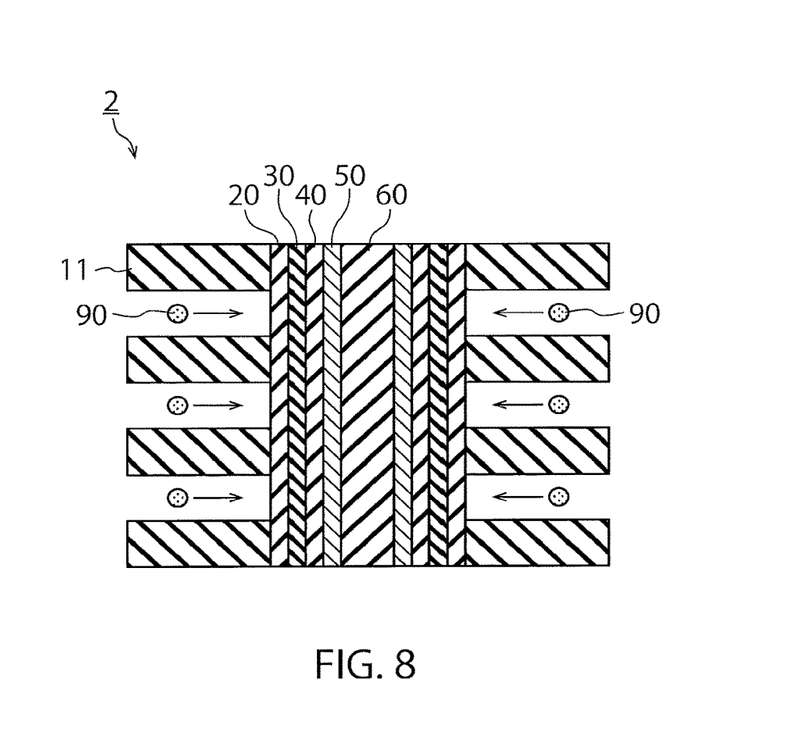
FIG. 8 is a cross-sectional view showing a part of a manufacturing process of a semiconductor device according to a second embodiment.

FIG. 8 is a cross-sectional view showing a part of a manufacturing process of a semiconductor device 2 according to a second embodiment. Hereafter, its differences from the first embodiment are mainly described. In the first embodiment, the reformation gas 202 including the defect termination elements 90 is introduced in forming the block insulator film 20.

Meanwhile, in the present embodiment, the reformation gas 202 is introduced when the insulator layers 12a are replaced by the conductor layers 12. Specifically, as shown in FIG. 8, when the insulator layers 12a are removed, parts of the block insulator film 20 are exposed. In the present embodiment, after the insulator layers 12a are removed, using the material gas 201 including tetrachlorosilane, the oxidation gas 203 including oxygen, and the reformation gas 202 including deuterium, a silicon oxide film in which crystal defects are terminated, that is, the block insulator film 20 is formed. It should be noted that when it is not desirable for the film thickness of the block insulator film 20 to increase, only the oxidation gas 203 and the reformation gas 202 may be introduced into the process chamber 101.

According to the present embodiment described above, the block insulator film 20 is reformed with the defect termination elements 90 included in the reformation gas 202. Thereby, sufficient measures can be applied against manufacturing defects (for example, back tunneling) caused by defects existing in the block insulator film 20 and defects arising at the interface between the block insulator film 20 and the charge storage capacitor film 30.

Third Embodiment

Figure 9:
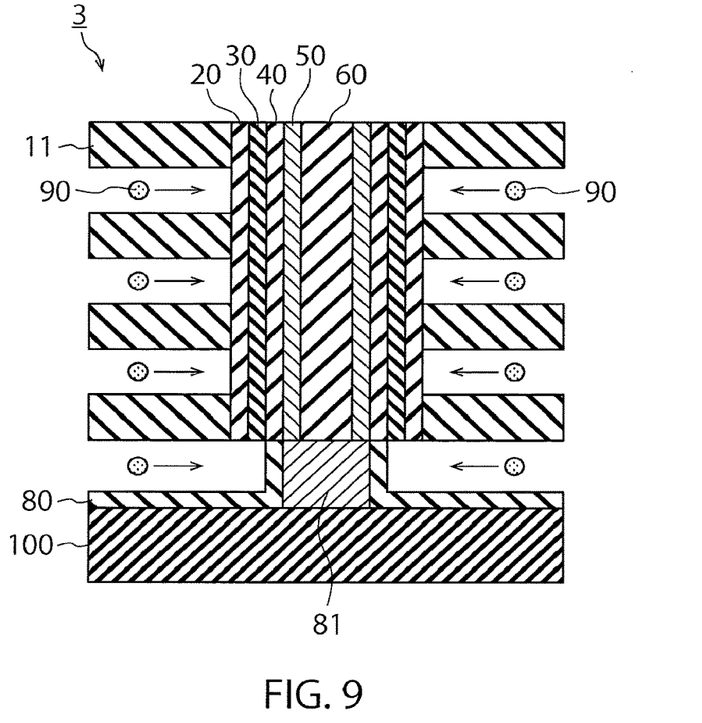
FIG. 9 is a cross-sectional view showing a part of a manufacturing process of a semiconductor device according to a third embodiment.

FIG. 9 is a cross-sectional view showing a part of a manufacturing process of a semiconductor device 3 according to a third embodiment. Herein, its differences from the second embodiment are mainly described. In the second embodiment, the reformation gas 202 is introduced onto exposed portions of the block insulator film 20 when the insulator layers 12a are replaced by the conductor layers 12.

In the present embodiment, when the reformation gas 202 including deuterium is introduced onto the exposed portions of the block insulator film 20, a gate insulator film 80 of a selection transistor is further formed. The selection transistor is a switching element for switching electricity to flow in the channel film 50 or not to flow therein.

In the semiconductor device 3 according to the present embodiment, a connection part 81 is between the channel film 50 and the silicon substrate 100. The connection part 81 is formed using polycrystalline silicon or single crystal silicon. As shown in FIG. 9, the gate insulator film 80 is formed on the surface of the connection part 81 and a part of the surface of the silicon substrate 100.

The gate insulator film 80 has been conventionally formed in a high temperature steam ($H_2O$) atmosphere. On the other hand, in the present embodiment, the gate insulator film 80 is formed in a heavy water atmosphere ($D_2O$) in place of the high temperature steam atmosphere. Chemical properties are substantially the same for heavy water and water. Hence, also when the gate insulator film 80 is formed by the method in the present embodiment, the film thickness thereof is substantially the same as that in the case of formation in a steam atmosphere. Namely, conventional oxidation conditions can be applied as they are.

According to the present embodiment described above, the gate insulator film 80 of a selection transistor can also be formed simultaneously to reformation of the block insulator film 20. Therefore, a manufacturing time can be shortened.

Moreover, in the present embodiment, the gate insulator film 80 can be formed under lower temperature conditions than conventional ones. Thereby, thermal load on peripheral circuits can be reduced.

Fourth Embodiment

Figure 10:
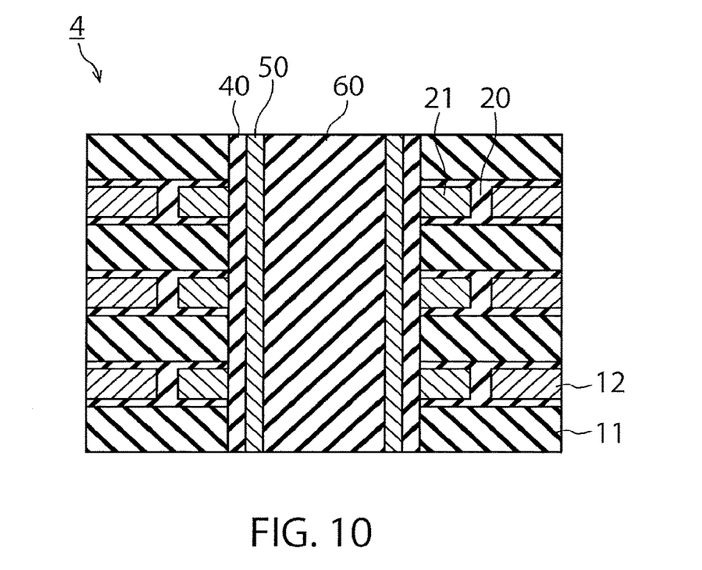
FIG. 10 is a cross-sectional view of the essential part of a semiconductor device according to a fourth embodiment.

FIG. 10 is a cross-sectional view of the essential part of a semiconductor device according to a fourth embodiment. In the present embodiment, its components similar to those of the semiconductor device 1 according to the first embodiment are given the same numerals, and their detailed description is omitted. A semiconductor device 4 according to the present embodiment can be applied to a so-called floating gate three-dimensional semiconductor memory which stores a charge in an electrically floating conductor.

In the semiconductor device 4 shown in FIG. 10, floating gates 21 are provided in place of the charge storage capacitor film 30. The floating gates 21 oppose to the conductor layers 12. The floating gates 21 and the conductor layers 12 are electrically insulated from each other by the block insulator film 20.

Figure 11:
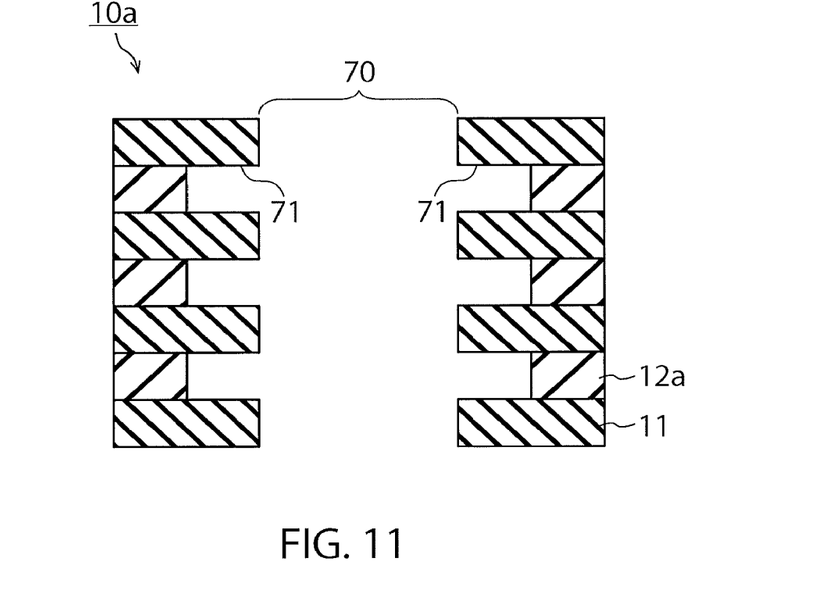
FIG. 11 is a cross-sectional view showing a part of a manufacturing process of a semiconductor device according to a fourth embodiment.
Figure 12:
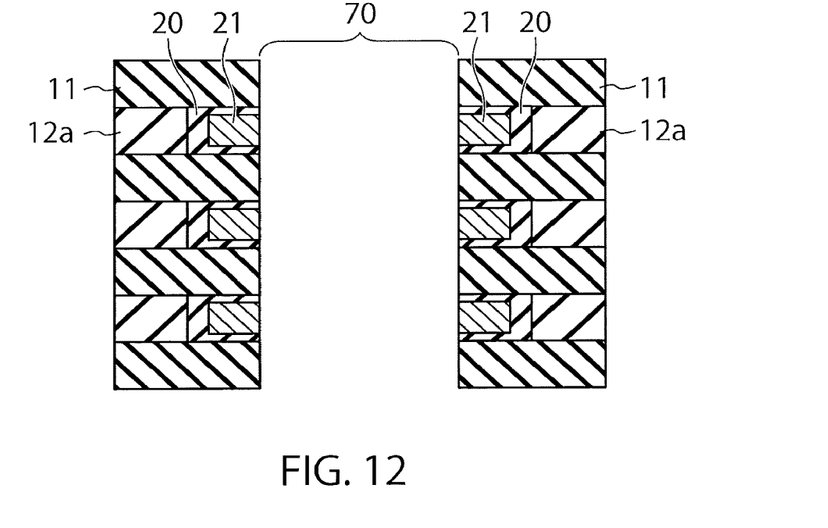
FIG. 12 is a cross-sectional view showing a next step of the manufacturing process shown in FIG. 11.
Figure 13:
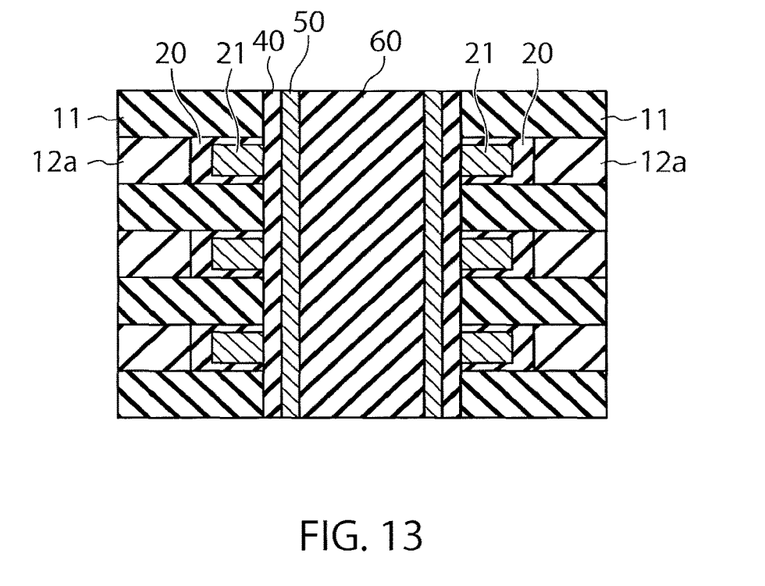
FIG. 13 is a cross-sectional view showing a next step of the manufacturing process shown in FIG. 12.

Hereafter, referring to FIG. 11 to FIG. 13, a manufacturing process of the semiconductor device 4 according to the present embodiment is briefly described. Notably, since the steps before and in forming the memory hole 70 are similar to those in the first embodiment, their description is omitted.

In the present embodiment, after forming the memory hole 70, parts of the insulator layers 12a are selectively etched from the memory hole 70 side using a liquid chemical which has a high selection ratio with respect to the insulator layer 11. As a result, as shown in FIG. 11, recess parts 71 opening toward the memory hole 70 side are formed.

Next, as shown in FIG. 12, the block insulator film 20 and the floating gates 21 are formed in the recess parts 71. Subsequently, as shown in FIG. 13, the tunnel insulator film 40, the channel film 50 and the core film 60 are formed similarly to the first embodiment. In this stage, the defect termination elements 90 are introduced onto each of the first insulator film 41, the second insulator film 42 and the third insulator film 43 constituting the tunnel insulator film 40.

Next, the insulator layers 12a are removed. After that, returning to FIG. 10, in gaps formed by the removal of the insulator layers 12a, the conductor layers 12 and the block insulator film 20 are formed. Thereby, the semiconductor device 4 is completed.

According to the present embodiment described above, the tunnel insulator film 40 is formed by the similar manufacturing method to that for the first embodiment. Therefore, also for the floating gate three-dimensional semiconductor memory, sufficient measures can be applied against various kinds of inconvenience caused by defects existing in the film and defects arising in forming an interface between different types of films.

Fifth Embodiment

Figure 14:
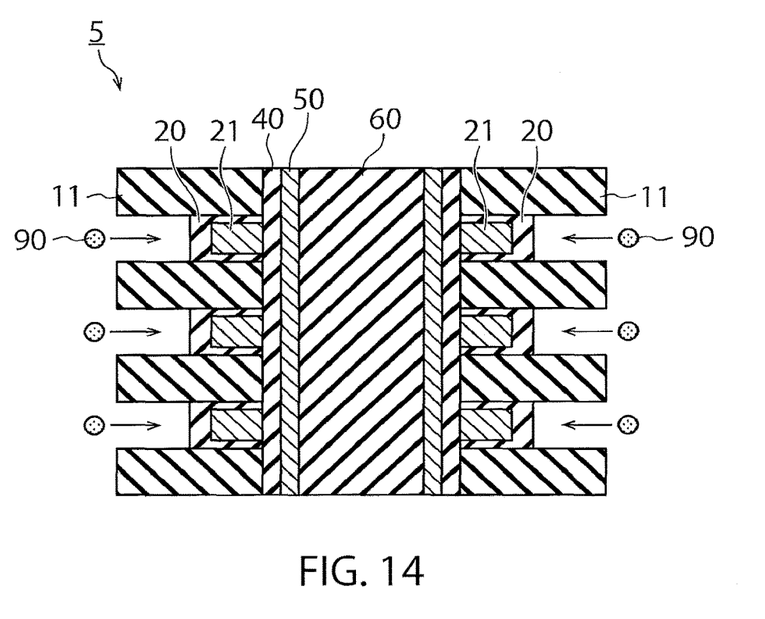
FIG. 14 is a cross-sectional view showing a part of a manufacturing process of a semiconductor device according to a fifth embodiment.

FIG. 14 is a cross-sectional view showing a part of a manufacturing process of a semiconductor device 5 according to a fifth embodiment. In the present embodiment, the manufacturing method of the second embodiment is applied to a floating gate three-dimensional semiconductor memory.

Specifically, as shown in FIG. 14, after removing the insulator layers 12a, the reformation gas 202 is introduced. Thereby, the defect termination elements 90 included in the reformation gas 202 adhere to the exposed portions of the block insulator film 20. As a result, the block insulator film 20 is reformed. Accordingly, sufficient measures can be applied against inconvenience caused by defects existing in the block insulator film 20 and defects arising at the interface between the block insulator film 20 and the charge storage capacitor film 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A semiconductor device comprising:
a stacked body in which insulating layers and conductive layers are alternately stacked;
a block insulating film formed on a surface of the insulating layers and a surface of the conductive layers;
a charge storage film formed on a surface of the block insulating film;
a tunnel insulating film formed on a surface of the charge storage film, the tunnel insulating film including a first insulating film formed on a surface of the charge storage film and containing silicon, oxygen, nitride and a defect termination element, and a second insulating film formed on a surface of the first insulating film and containing silicon, oxygen, and the defect termination element; and
a channel film on a surface of the second insulating film, wherein
the channel film and the second insulating film are in contact with each other, and
the defect termination element concentration of the first insulating film is higher than that of the second insulating film.

2. The semiconductor device according to claim 1, wherein the defect termination element is at least one of deuterium hydrogen, fluorine, carbon, selenium, or any compounds thereof.

3. The semiconductor device according to claim 1, wherein a nitride concentration of the first insulating film is higher than that of the second insulating film.

4. A manufacturing method of a semiconductor device, comprising:

forming a stacked body in which first layers and second layers alternately stacked;
forming a hole penetrating the stacked body;
forming a block insulator film in the hole;
forming a charge storage capacitor film on a surface of the block insulator film;
forming a first insulator film on a surface of the charge storage capacitor film;
forming a second insulator film on a surface of the first insulator film;
forming a third insulator film on a surface of the second insulator film; and
forming a channel film on a surface of the third insulator film, wherein
the first insulator film, the second insulator film or the third insulator film is formed by an ALD method using gas including deuterium, and a deuterium concentration of a gas used for forming the second insulator film is higher than that of a gas used for forming each of the first insulator film and the third insulator film.

* * * * *